United States Patent [19]

Kolinski et al.

[11] Patent Number: 5,548,734
[45] Date of Patent: Aug. 20, 1996

[54] EQUAL LENGTH SYMMETRIC COMPUTER BUS TOPOLOGY

[75] Inventors: Jerzy Kolinski, Portland; John Sprietsma, Hillsboro; Stephen Pawlowski, Beaverton; Henry Schaechterle, Hillsboro, all of Oreg.

[73] Assignee: Intel Corporation, Santa Clara, Calif.

[21] Appl. No.: 368,716

[22] Filed: Jan. 4, 1995

Related U.S. Application Data

[63] Continuation of Ser. No. 38,235, Mar. 26, 1993, abandoned.

[51] Int. Cl.⁶ .................................................. G06F 13/00
[52] U.S. Cl. .................................................. 395/306
[58] Field of Search ........................ 395/306; 307/475, 307/500, 542; 361/397, 407, 412, 384, 413; 439/62

[56] References Cited

U.S. PATENT DOCUMENTS

| | | | |
|---|---|---|---|
| 3,992,686 | 11/1976 | Canning | 333/84 |
| 4,019,162 | 4/1977 | Banning | 333/96 |
| 4,744,076 | 5/1988 | Elias | 370/85 |
| 4,777,615 | 10/1988 | Potash | 395/800 |
| 4,790,762 | 12/1988 | Harms et al. | 439/59 |
| 4,879,433 | 11/1989 | Gillett et al. | 174/32 |
| 4,922,449 | 5/1990 | Donaldson et al. | 395/200 |
| 5,006,961 | 4/1991 | Monico | 361/413 |
| 5,010,493 | 4/1991 | Matsumoto et al. | 364/490 |
| 5,060,111 | 10/1991 | Takashima | 361/384 |
| 5,083,238 | 6/1992 | Bousman | 361/413 |
| 5,086,271 | 2/1992 | Huill et al. | 324/158 R |
| 5,089,669 | 2/1992 | Piper et al. | 174/117 |
| 5,091,822 | 2/1992 | Takashima | 361/384 |
| 5,122,691 | 6/1992 | Balakrishnan et al. | 307/475 |
| 5,146,230 | 9/1992 | Hules | 342/374 |
| 5,210,682 | 5/1993 | Takashima | 361/396 |
| 5,257,266 | 10/1993 | Maki | 371/8.2 |
| 5,287,022 | 2/1994 | Wilsher | 307/542 |

*Primary Examiner*—Ayaz R. Sheikh
*Attorney, Agent, or Firm*—Blakely, Sokoloff, Taylor & Zafman

[57] ABSTRACT

An equal length symmetric computer bus topology. The equal length symmetric computer bus topology provides a bus signal path to a number of bus nodes. Each bus signal path extends from each node on the computer bus to a central junction point. The bus signal paths are of equal length and have identical electrical characteristics. The equal length symmetric computer bus topology minimizes the effect of transmission line reflections upon the bus signals. The equal length symmetric computer bus topology also causes very little clock skew.

20 Claims, 14 Drawing Sheets

EQUAL LENGTH SYMMETRIC COMPUTER BUS TOPOLOGY

This is a continuation of application Ser. No. 08/038,235, filed Mar. 26, 1993, now abandoned.

BACKGROUND OF THE INVENTION

1. Field of the Invention

This invention relates to digital computer bus systems. More specifically to an equal length symmetric bus topology that reduces the impact of transmission line reflections.

2. Art Background

A digital computer employs a computer bus to communicate information between the different parts of the computer system. Buses are simply a set of parallel electrical lines used to communicate information signals. FIG. 1 illustrates in block diagram form, a typical computer system with a bus 15. The bus 15 connects the processor 11 to memory 13 and to various Input/Output ("I/O") devices 12, such as displays, keyboards, etc.

There can be more than one bus in a single computer system. FIG. 1 illustrates a computer system with a main computer bus 15 and a secondary computer bus 17. The computer system uses the main computer bus 15 for high-speed memory access and other time critical functions. The secondary bus 17 operates at a slower speed in order to accommodate slower I/O devices 19. A bus controller 18 couples the main computer bus 15 to the secondary computer bus 17.

A typical microcomputer bus is physically constructed of a set of parallel traces embedded in a printed circuit board. Most microcomputers incorporate the computer bus as electrical traces etched on the main printed circuit board called the motherboard.

The clock speeds of modern computer processors are continually increasing in order to achieve faster performance. This is especially true for microprocessor based computer systems. As a result, the buses that the processors use to communicate information between the different parts of a computer system also need to function at increasingly higher frequencies. Computer designers, therefore need to carefully design computer buses to handle the higher operating frequencies in order to maintain high quality bus signals.

When the operating frequency of a computer bus, such as the bus 15 illustrated in FIG. 1, becomes very high, each of the bus signals in the bus 15 begin to exhibit transmission line effects which can degrade the quality of the bus signal. One type of transmission line effect that degrades signal quality is a transmission line reflection. Impedance discontinuities along the signal path of a bus signal cause transmission line reflections to occur. At each point in a signal path where an impedance change occurs, a transmission line reflection will be generated. The greater the impedance mismatch, the greater the transmission line reflection will be.

There are often a number of impedance discontinuities along the signal path of a computer bus signal. Common computer bus signal impedance discontinuities include mismatched loads, electrical connectors, line stubs, device input, and board layer changes. It is therefore desirable to design a computer bus that minimizes the effect transmission line reflections have on the signals.

SUMMARY OF THE INVENTION

It is therefore an object of the present invention to provide a computer bus structure that minimizes the effect of transmission line reflections and provides high quality computer bus signals.

It is a further object of the present invention to provide a bus structure that transmits bus signals from a bus driver to several bus receivers with an equal propagation delay from the bus driver to all the bus receivers.

It is a further object of the present invention to provide a bus structure that transmits bus signals to several receivers with minimal signal skew between the receivers.

These and other objectives are accomplished by the equal length symmetric bus topology of the present invention. In the bus topology of the present invention each bus signal path extends from a central junction point to each node on the computer bus. The signal paths are of equal length and have identical electrical characteristics.

BRIEF DESCRIPTION OF THE DRAWINGS

The objects, features and advantages of the present invention will be apparent to one skilled in the art, in view of the following detailed description in which:

FIG. 2b is a lattice diagram of the transmission line reflections that occur when a voltage source sends a step voltage down the transmission line illustrated in FIG. 2a.

FIG. 2c is a plot of the voltage levels at the driver end and the receiver end of a transmission line when a voltage source sends a step voltage down the transmission line illustrated in FIG. 2a.

FIG. 3b illustrates an analog electrical signal used to represent the ideal digital signal given in FIG. 3a.

FIG. 4b is a transmission line model of the prior art computer bus in FIG. 4a.

DETAILED DESCRIPTION OF THE INVENTION

An equal length symmetric computer bus topology is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention unnecessarily.

TRANSMISSION LINE REFLECTIONS

Figure 1:
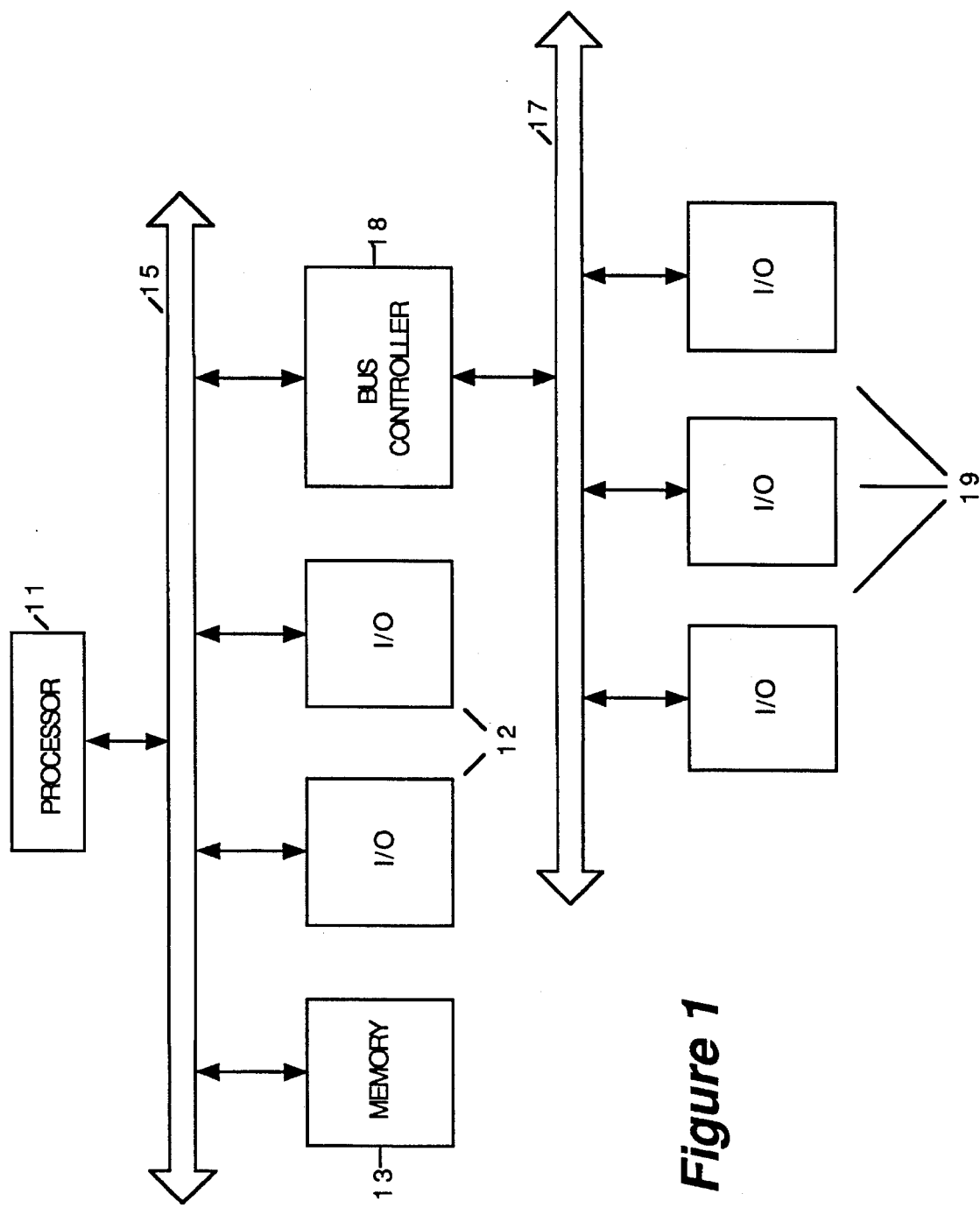
FIG. 1 is a block diagram of a computer bus used to communicate information between different parts of a computer system.
Figure 2A:
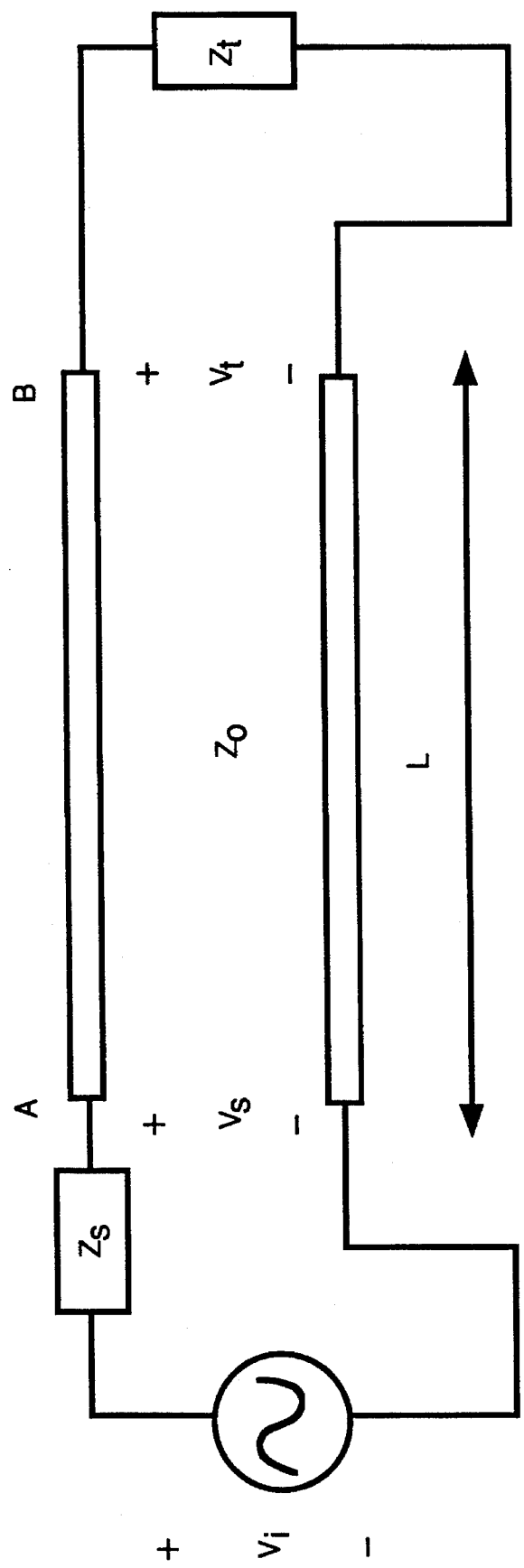
FIG. 2a is an electrical diagram of a transmission line.

FIG. 2a illustrates a transmission line with a line impedance of $Z_0$ and a delay per unit length of $T_{pd}$. At one end of the transmission line is a voltage source $V_i$ and a source impedance of $Z_s$. At the other end of the transmission line is a load with an impedance of $Z_l$. When the source impedance $Z_s$, the transmission line impedance of $Z_0$, and the load impedance of $Z_l$ are not perfectly matched, the impedance mismatch will generate transmission line reflections on the transmission line.

For example, consider the case where the transmission line impedance is $Z_0$, the source impedance is $Z_s=0.33Z_0$, and the load impedance is $Z_l=2Z_0$. The load voltage reflection coefficient $r_l$ at the point $V_l$ is defined the equation:

$$r_l = \frac{Z_l - Z_0}{Z_l + Z_0} = \frac{2Z_0 - Z_0}{2Z_0 + Z_0} = \frac{Z_0}{3Z_0} = +0.33$$

Similarly, the source voltage reflection coefficient $r_s$ at the point Vs is defined by the equation:

$$r_s = \frac{Z_s - Z_0}{Z_s + Z_0} = \frac{0.33Z_0 - Z_0}{0.33Z_0 + Z_0} = \frac{-0.66Z_0}{1.33Z_0} = -0.5$$

The load voltage reflection coefficient $r_l$ and the source voltage reflection coefficient $r_s$ define the amount of voltage that the impedance mismatches at the load impedance and the source impedance reflect back, respectively.

If, for example, the voltage source $V_i$ drives the transmission line with a step voltage, a series of reflections will occur back and forth across the transmission line until a steady state voltage level is reached. When the voltage source $V_i$ drives the transmission line with a unit step voltage (1 V), a voltage division first occurs dividing voltage $V_i$ between source impedance $Z_s$ and transmission line impedance $Z_0$. This creates an initial voltage at point $V_s$ that can be calculated using the equation:

$$V_s = V_i \frac{Z_0}{Z_s + Z_0} = (1\ V) \frac{Z_0}{0.33Z_0 + Z_0} = (1\ V) \frac{Z_0}{1.33Z_0} = 0.75\ V$$

Figure 2B:
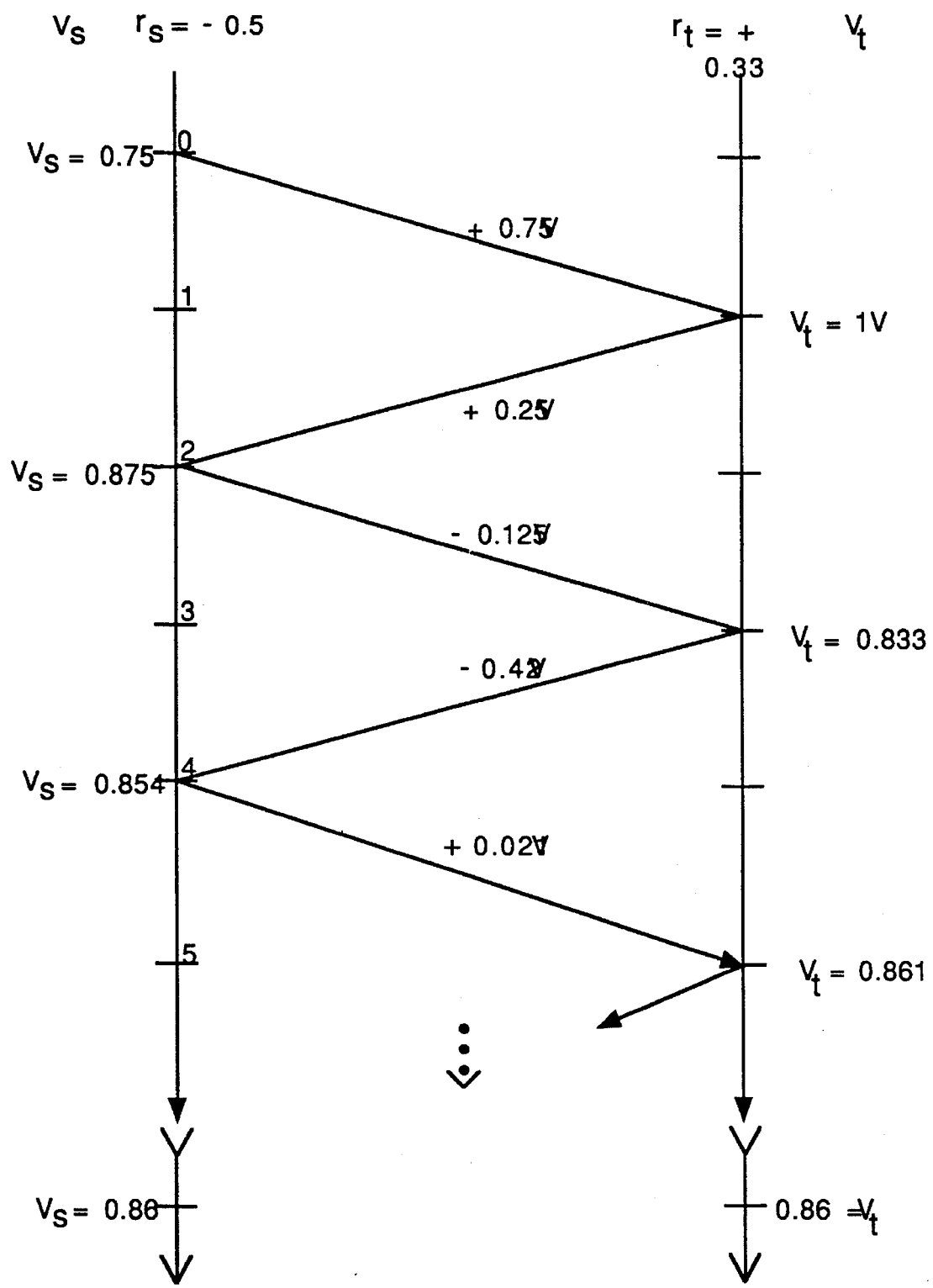

This voltage travels down the transmission line until it reaches the load impedance $Z_l$. At that point the load reflects back some voltage as determined by the load voltage reflection coefficient $r_l$ defined above. The total voltage at point $V_l$ is equal to the incoming voltage plus the reflected voltage which is 0.75 V$(1+r_l)$=0.75 V$(1+0.33)$=1 V. The reflected voltage (0.75 V*$r_l$=0.25 V) travels back to the voltage source. When the reflected voltage reaches the voltage source, the voltage source reflects half of the reflected voltage back again towards the load as determined by the source voltage reflection coefficient $r_s$ as defined above. FIG. 2b provides a lattice diagram of the voltage reflections that occur in the system.

The voltage reflections continue back and forth across the transmission line until the transmission line reaches a steady state voltage level. The steady state voltage level ($V_{ss}$) at both of the points $V_s$ and $V_l$ is calculated by dividing the steady state input voltage $V_i$ between source impedance $Z_s$ and load impedance $Z_l$:

$$V_{ss} = V_i \frac{Z_l}{Z_s + Z_l} = 0.86\ V$$

Figure 2C:
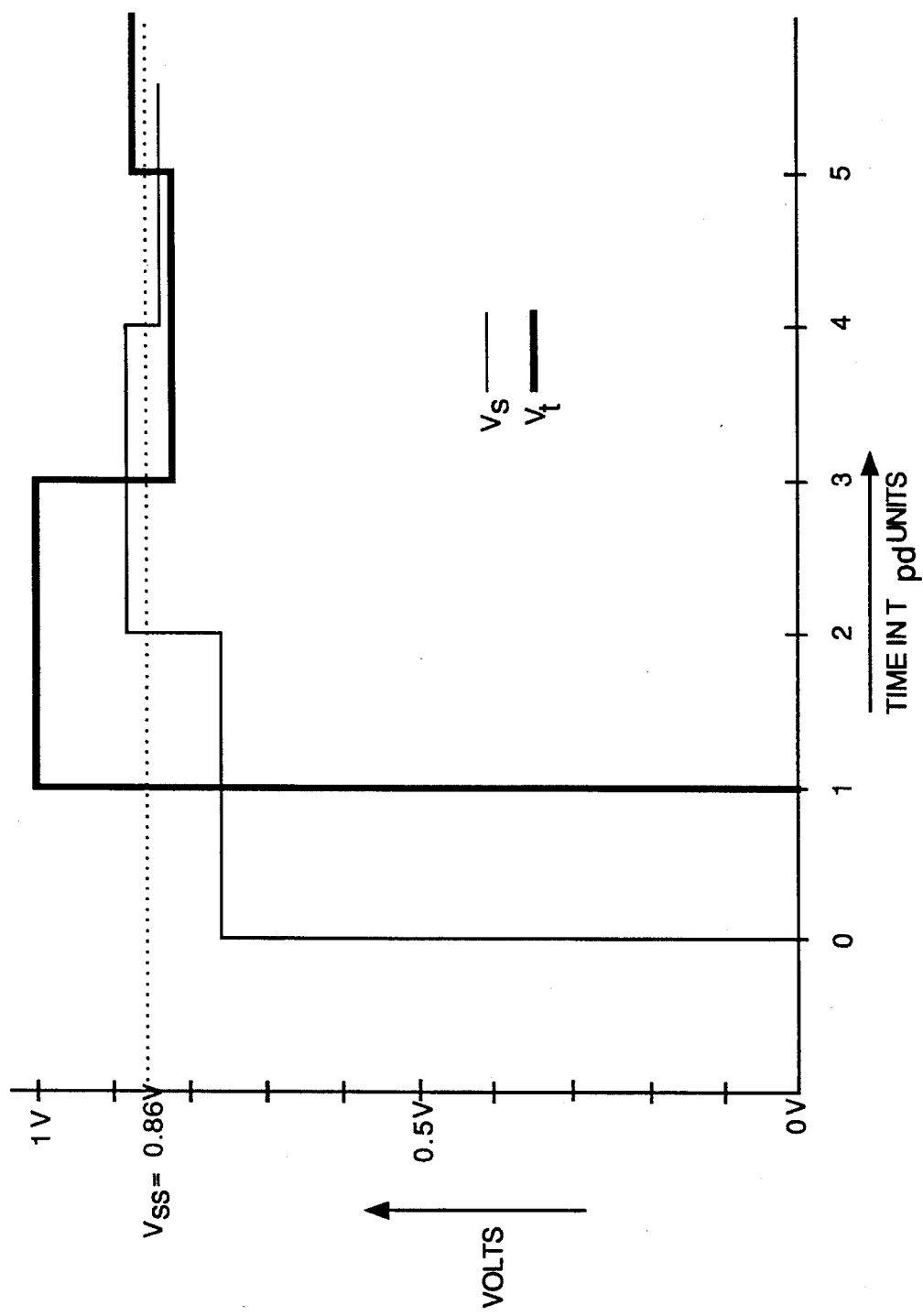

FIG. 2c illustrates a plot of the voltage levels at the voltage source end of the transmission line $V_s$ and at the load end of the transmission line $V_l$ when a voltage source sends unit step voltage down the transmission line. It is apparent from the voltage plot of FIG. 2c that the transmission line reflections caused by impedance mismatch make the electrical signal oscillate above and below the steady state voltage level $V_{ss}$.

DIGITAL SIGNALS

Figure 3A:
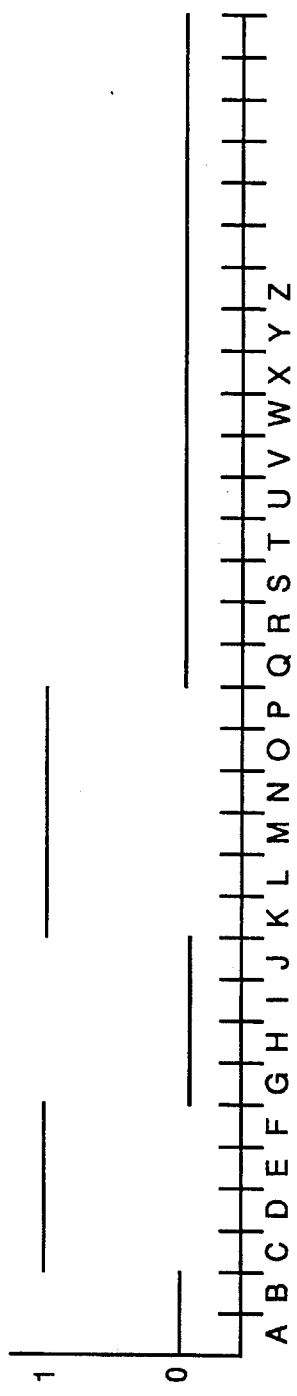
FIG. 3a illustrates an ideal digital signal.

FIG. 3a illustrates an ideal digital signal. The ideal digital signal always is either at a logic high level ("1") or a logic low level ("0"). At the points where the ideal digital signal switches logic levels, the change takes place instantaneously.

Figure 3B:
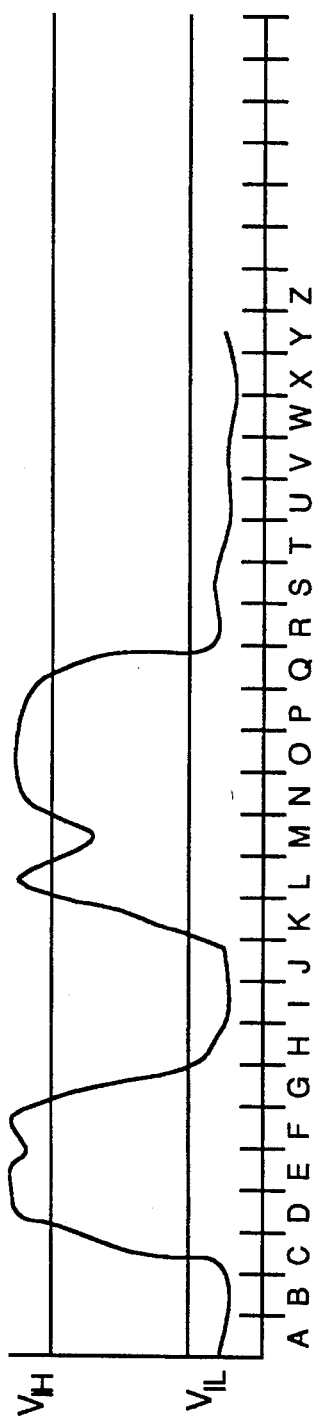

FIG. 3b illustrates an analog electrical signal at the input of digital device used to represent the ideal digital signal given in FIG. 3a. On the vertical axis, two input voltage levels $V_{IH}$ and $V_{IL}$ are marked. These levels represent the high level input and the low level input threshold voltages respectively. When the electrical signal input voltage is above the high level input threshold voltage $V_{IH}$, the electrical signal at the output of a digital device indicates a logic high level. When the electrical signal voltage is below the low level input threshold voltage $V_{IL}$, the electrical signal at the output of a digital device indicates a logic low level. When the electrical signal voltage is between the high level input threshold voltage $V_{IH}$ and the low level input threshold voltage $V_{IL}$, the signal is invalid and should not be sampled. This situation occurs when the device is switching.

Referring to the analog electrical signal of FIG. 3b, the transitions between logic high input and logic low input levels cannot take place instantaneously. For example, when the electrical signal changes from a logic low state to a logic high state during time period C the electrical signal is neither high nor low. This time period is referred to as the signal rise time. Similarly, when the electrical signal changes from a logic high state to a logic low state during time period G there is another time period where the electrical signal is neither high nor low. This time period is referred to as the signal fall time. During either the rise time or the fall time, the analog electrical signal is invalid and should not be sampled.

Figure 3C:
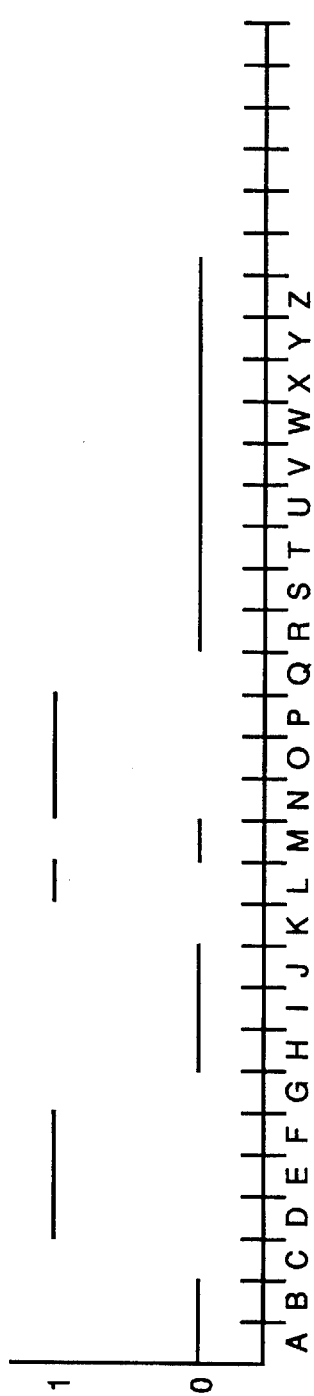
FIG. 3c illustrates how the analog electrical signal of FIG. 3a appears in digital form.

FIG. 3c illustrates how a digital device interprets the analog electrical signal of FIG. 3b appears when the analog electrical signal is connected to a digital device. During the periods where the electrical signal is above the high level input threshold voltage $V_{IH}$, a logic high value is presented. During the periods where the electrical signal is below the low level input threshold voltage $V_{IL}$, a logic low value is presented. When the electrical signal is between the high level input threshold voltage $V_{IH}$ and the low level input threshold voltage $V_{IL}$ such as rise time period C and fall time period G, the output of a digital device is in transition between the logic levels and the output is undefined.

As demonstrated in the previous section, transmission line reflections degrade the quality of electrical signals by causing voltage oscillations before transmission line reaches a steady state voltage level. Time periods K–O of FIG. 3b illustrate an oscillation caused by a transmission line reflection. At time period L, the signal is above the high level input threshold value. However, at time period M a transmission line reflection temporarily forces the signal is below the high level input threshold value $V_{IH}$. The dip below the high level input threshold value $V_{IH}$ is referred to as an undershoot. Referring to time period M in FIG. 3c, when the electrical signal drops below the high level input threshold value $V_{IH}$, the output of the digital device may transition to the logic level low for a short period of time causing voltage glitch. The glitch is illustrated as a logic low in FIG. 3c for time period M. During time period N the electrical signal in FIG. 3b again rises above the high level input threshold value $V_{IH}$ causing the digital interpretation in FIG. 3c to be a logic high level.

Referring to FIG. 3c, the undershoot in time period M at the input of a digital device may cause a logic level low glitch. This glitch can cause a false triggering of the device which receives the signal. For example, the undershoot in time period M causes problems for synchronous buses. In order to implement a synchronous memory bus, a computer system propagates both a clock signal and data signals on the bus. A receiver uses the rising edge of the clock signal to latch in the data. The clock signal must monotonically pass through the threshold region between $V_{IL}$ and $V_{IH}$ to correctly clock in the data. When the signal changes from a logic low level to a logic high level twice in a row, as illustrated in time periods K–L and M–O, the signal will likely accidentally trigger the receiver to latch in invalid data. This occurs since the first rising edge latches in the correct data and the second rising edge caused by the undershoot latches in data when the data is no longer valid at the input of the device.

A PRIOR ART COMPUTER BUS

Figure 4A:
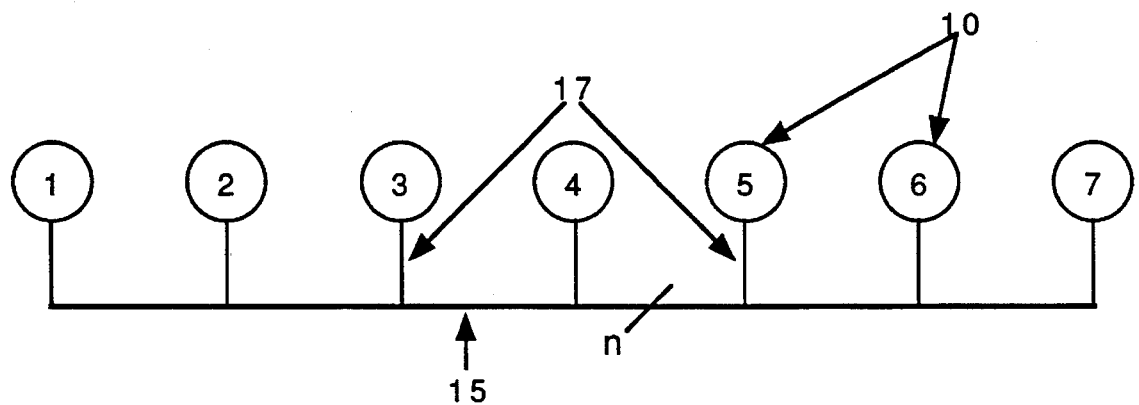
FIG. 4a is a block diagram of a typical prior art computer bus.

FIG. 4a illustrates, in block diagram form, a prior art microcomputer bus. The microcomputer bus of FIG. 4a consists of a backplane bus 15, several nodes 10, and stubs 17 connecting each node 10 to the backplane bus 15. The bus illustrated in FIG. 4a has n parallel lines for carrying n different signals. Each node 10 on the bus can act as a driver or a receiver of signals. The nodes 10 share the bus according to a defined bus protocol.

The backplane bus 15 of a microcomputer is usually constructed of a printed circuit board with a set of n embedded electrical traces. The stubs 17 are electrical sockets electrically connected to the printed circuit board traces. The individual nodes 10 are usually printed circuit board cards which can be inserted into the electrical sockets to expand the computer system as needed.

Figure 4B:
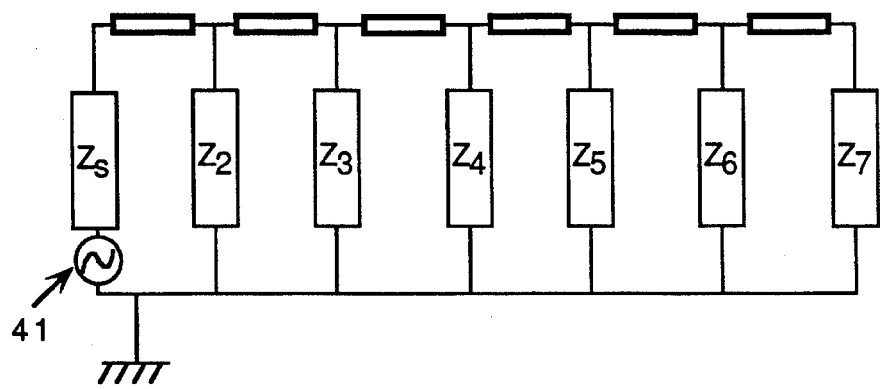

When the operating frequency of a microcomputer bus, such as the bus illustrated in FIG. 4a, becomes very high, the signal path along the backplane 15 of the bus should be modeled as a transmission line. FIG. 4b illustrates an electrical diagram of the computer bus of FIG. 4a in which the signal path along the backplane has been modeled as a transmission line.

In the transmission line model of FIG. 4b, node 1 has been designated as a signal driver. The driver, node 1, is modeled as a voltage source 41 and a source impedance $Z_s$. The remaining nodes 2–7 have been modeled as receiver nodes. The receiver nodes 2–7 have been assigned impedance loads $Z_2$–$Z_7$. Between each receiver node 2–7, the backplane bus acts as a transmission line. Provided that the stubs are very small, the stubs will not have any significant effect on the transmission line model. The stubs are therefore modeled as direct connections that do not effect the transmission line model.

When the voltage source 41 of the driver node 1 drives a signal, the signal propagates along the backplane bus to each of the other nodes 2–7. As the signal reaches each receiver node, the impedance mismatch between the backplane transmission line and the receiver impedance produces a voltage reflection that propagates back down the bus backplane to the voltage source 41. For example, when the driver node 1 drives a signal, the signal would first travel through the stub of the first node and along the backplane until it reaches the stub for node 2. At this point, the impedance mismatch between the backplane transmission line and the load impedance $Z_2$ produces a first voltage reflection. The signal continues along the backplane transmission line until it reaches the stub for node 3. At the stub for node 3, the impedance mismatch between the backplane transmission line and the load impedance $Z_3$ generates a second voltage reflection. The signal continues along the backplane transmission line producing a voltage reflection at each node.

The transmission line reflections distort the waveforms produced at the driver node and the receiver nodes. The distortion produced at the driver node is not a problem since no device samples the waveform at the driver. However, the distortions at the receiver nodes are a problem. The distortion produced by the transmission line reflections is most apparent at the receiver nodes nearest the driver node. In FIG. 4b for example, the transmission line reflections produced from the impedance mismatch at nodes 3–7 distort the waveform at node 2, the node nearest the driver node.

Figure 4C:
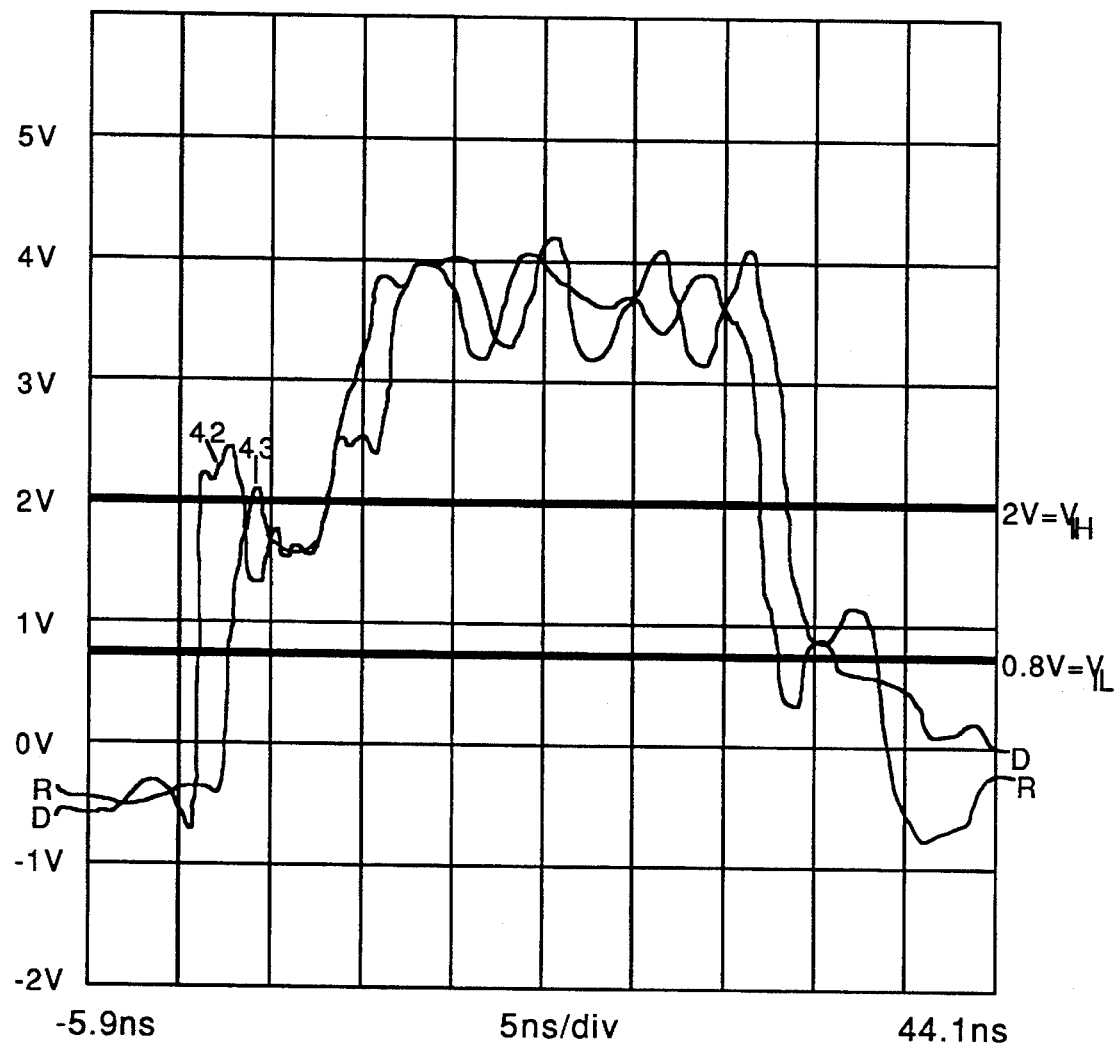
FIG. 4c is a plot of the voltage levels at a driver node and a receiver node when the driver node sends a step voltage to the receiver node on a prior art computer bus.

FIG. 4c illustrates a plot of the voltage levels at the driver node 1 and at the receiver node 2 for the prior art computer bus depicted in FIG. 4a and FIG. 4b when the driver at node 1 drives a signal from a logic low state to a logic high state and back to a logic low state again. Initially, the driver voltage increases linearly. At point 42 transmission line reflections begin to distort the waveform of the driver signal. Similarly, the receiver signal initially increases linearly until transmission line reflections begin to distort the receiver waveform. At point 45 the receiver signal rises above the high level input threshold value $V_{IH}$, but then a transmission line reflection temporarily forces the signal below the high level input threshold value $V_{IH}$. As explained in the previous section, the undershoot at point 45 can accidentally cause devices connected to the receiver node to trigger twice.

EQUAL LENGTH SYMMETRIC COMPUTER BUS

Figure 5A:
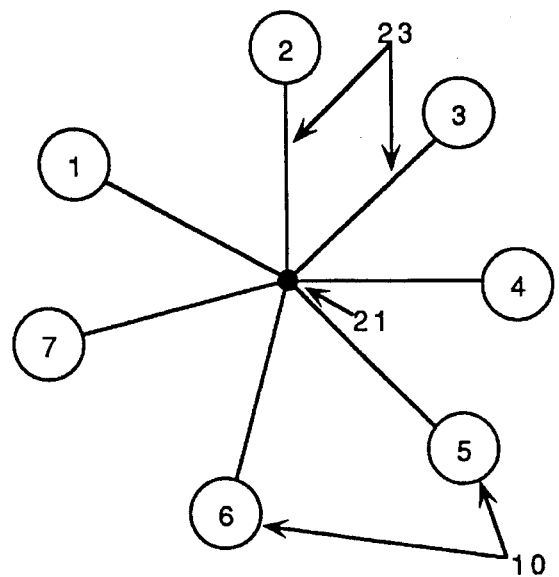
FIG. 5a is a block diagram of a computer bus with an equal length symmetric topology.

FIG. 5a provides an illustration of the bus topology of the present invention. Like the microcomputer bus of FIG. 4a, the bus of the present invention has a number of nodes 10 that can both transmit and receive bus signals. However, the bus of the present invention is not implemented as a set of parallel lines with nodes branching off. Instead, each node 10 has a signal path 23 that leads to a central junction point 21. The signal paths 23 are constructed such that the signal path 23 from each node 10 to the central junction point 21 is of a predetermined equal length and each signal path 23 has the same electrical characteristics. All the receiver nodes 10 must have the same electrical characteristics.

Figure 5B:
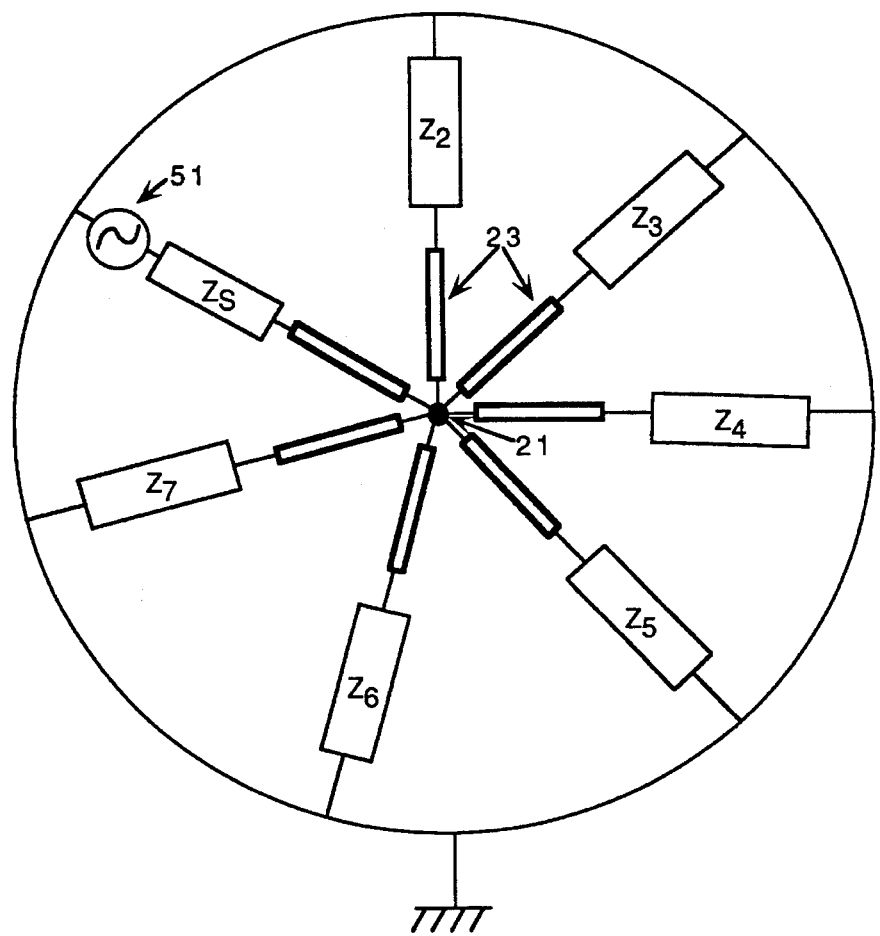
FIG. 5b is a transmission line model of the computer bus with an equal length symmetric topology.

FIG. 5b illustrates a transmission line model of the equal length symmetric bus of the present invention illustrated in FIG. 5a. A driver node is modeled as a voltage source 51 and a source impedance $Z_s$. Each of the receiver nodes 2–7 are modeled as load impedances $Z_2$–$Z_7$. Each signal path 23 leading from the central junction point 21 to a receiver load impedance is modeled as a transmission line.

When the voltage source 51 in the driver node drives a signal, the signal first passes through the source impedance and a first stretch of transmission line. The signal then reaches the central junction point 21 where there is a severe impedance mismatch. At the central junction point 21, the signal experiences a change from traveling on a path with an impedance of $Z_0$ to traveling on several parallel paths with a net path of impedance of:

$$Z_{sum} = \cfrac{1}{\cfrac{1}{Z_0}+\cfrac{1}{Z_0}+\cfrac{1}{Z_0}+\cfrac{1}{Z_0}+\cfrac{1}{Z_0}+\cfrac{1}{Z_0}} = \frac{Z_0}{6} \ \Omega$$

This severe impedance mismatch creates a large voltage reflection that will reflect back from the central junction point 21 to the voltage source 51. The size of the reflection will be determined by the reflection coefficient $r_c$ which is calculated by $$r_c = \frac{Z_{sum}-Z_0}{Z_{sum}+Z_0} = \frac{\frac{1}{6}Z_0 - Z_0}{\frac{1}{6}Z_0 + Z_0} = \frac{-\frac{5}{6}Z_0}{\frac{7}{6}Z_0} = -\frac{5}{7} = -0.714$$

The voltage reflection will severely distort the waveform at the driver but, as stated earlier, this is not a problem since no device samples the waveform at the driver. The signal continues to travel down each of the receiver signal paths until the signal reaches the receiver load impedances $Z_2$–$Z_7$.

Figure 5C:
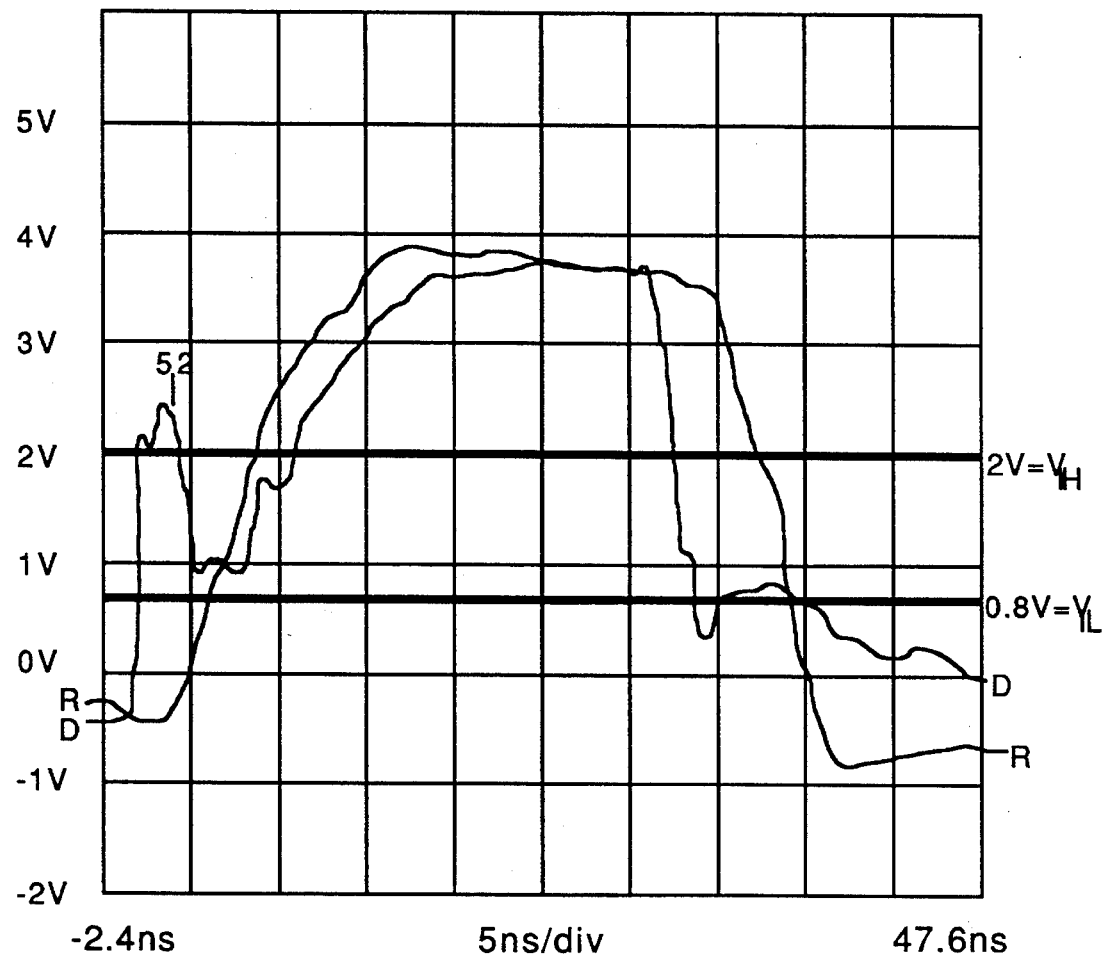
FIG. 5c is a plot of the voltage levels at a driver node and a receiver node when the driver node sends a step voltage to the receiver node on the computer bus with an equal length symmetric topology.

FIG. 5c illustrates a plot of the voltage levels at the driver node and a receiver node for the symmetric equal length computer bus depicted in FIG. 5a and FIG. 5b when the driver at node 1 drives a signal from a logic low state to a logic high state and back to a logic low state again. Since all the receiver nodes are identical in the symmetric equal length computer bus, the waveforms at all the receiver nodes are identical. Initially, the driver voltage increases linearly. At point 52, a transmission line reflection from the central junction point 21 forces the waveform of the driver signal down. The receiver signal, however, increases linearly straight through the threshold region bounded by the high level input threshold value $V_{IH}$ and the low level input threshold value $V_{IL}$. No undershoot is caused by the transmission line reflections. The equal length symmetric computer bus of the present invention is therefore superior to prior art computer buses.

The equal length symmetric computer bus of the present invention also provides additional advantages. Since transmission path from the driver to every receiver is of equal length, there is an equal propagation delay from the driver to all the receivers. Furthermore, there is no signal skew between the receivers.

PHYSICAL CHARACTERISTICS

In order to construct an equal length symmetric computer bus, the electrical lines from each bus node must be of equal length and the electrical properties of each electrical line must be identical.

Figure 6:
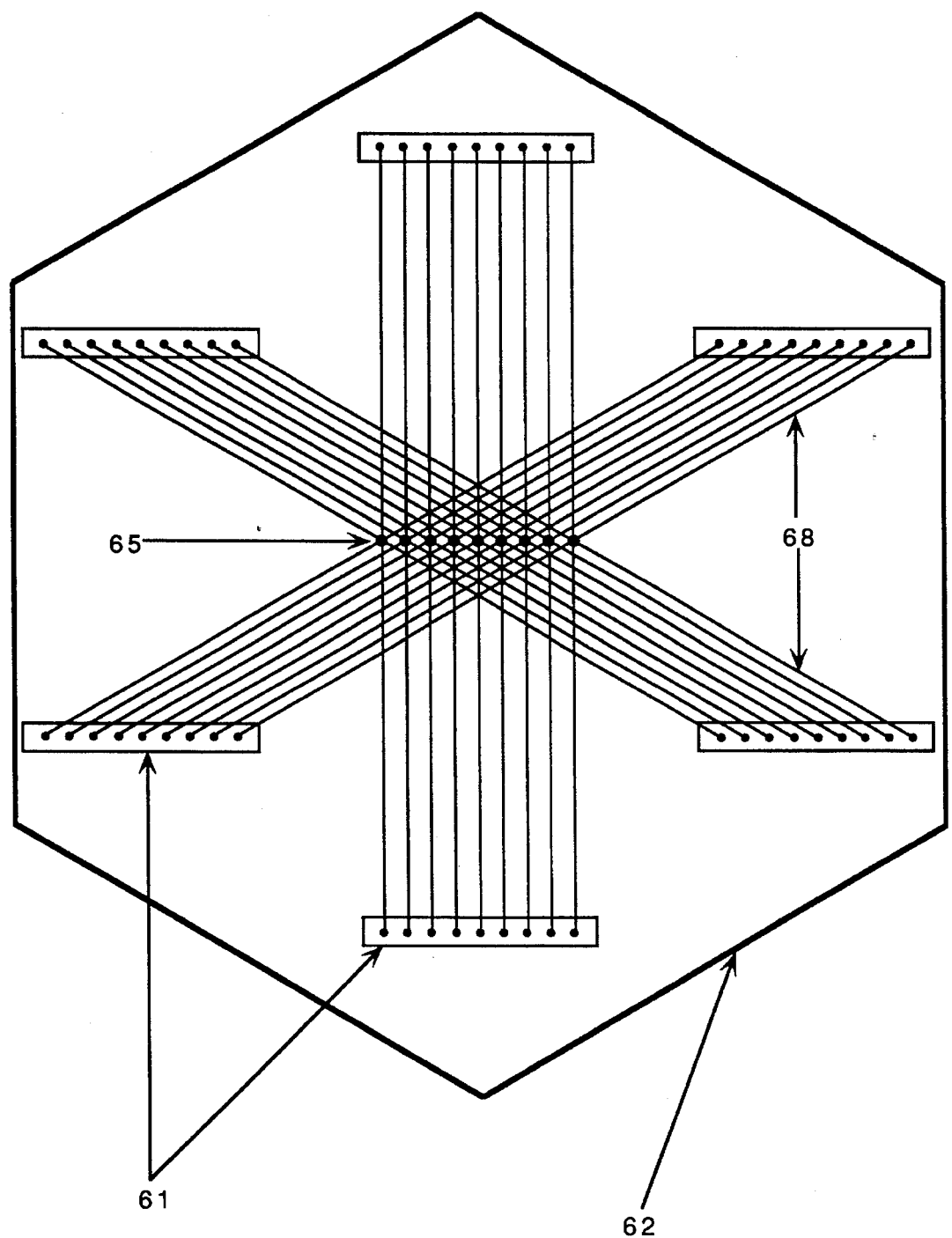
FIG. 6 is a diagram of a possible embodiment of a computer bus with an equal length symmetric topology.

One method for creating an equal length symmetric computer bus is to have a row of central junctions with electrical traces extending radial outwards from each central junction. FIG. 6 illustrates an equal length symmetric computer bus constructed in this manner. At the center of FIG. 6 is a row of central nodes 65. Extending radially outward from each central node are six equal length electrical traces 68. At the end of each set of electrical traces 68 is a bus connector 61.

The equal length symmetric computer bus illustrated in FIG. 6 has several disadvantages. The layout of the bus connectors 61 in the computer bus system of FIG. 6 is very nonstandard. Two pairs of bus connectors 61 are in line with one other thereby placing a limitation on the length of the circuit boards that can be inserted. Furthermore, in order to extend radially outward, the equal length lines 68 must cross over each other several times near the central nodes 65. Each time the traces cross over one another, the board requires more than one printed circuit board layer. Finally, the layout of the bus system causes the printed circuit board 62 to have a very non standard hexagonal form-factor that requires a large amount of space. It is desirable to instead implement an equal length symmetric computer bus that is compatible with the current motherboard layout in personal computers.

Figure 7A:
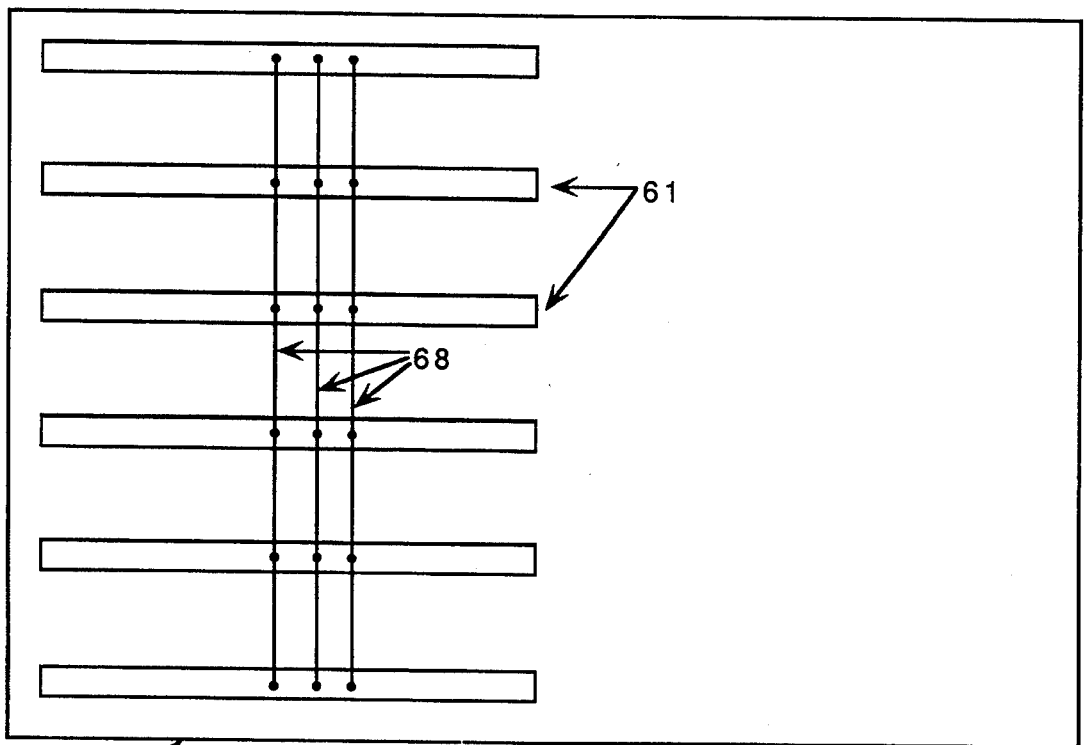
FIG. 7a is a diagram of a typical prior art computer bus.

Referring to FIG. 7a, most personal computers implement the computer bus as a set of parallel traces 68 parallel to one edge of the mother board 62. A number of bus connectors 61 are spaced along the parallel bus traces 68 perpendicular to the bus traces 68.

Figure 7B:
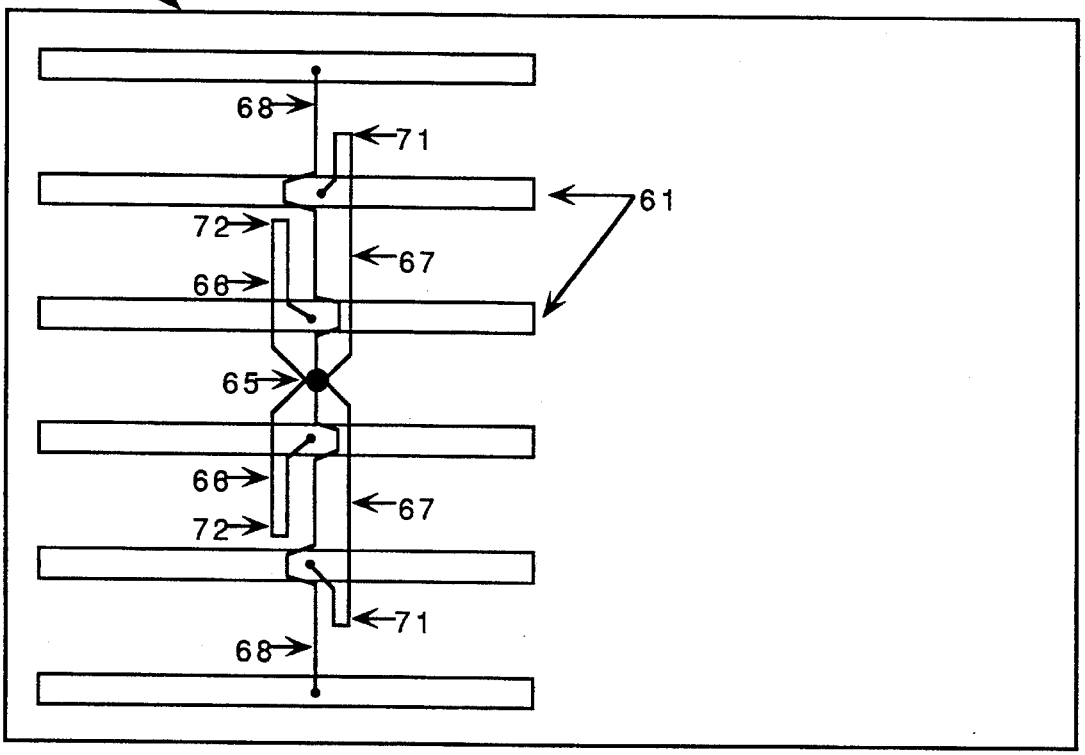
FIG. 7b is a diagram of a possible embodiment of a computer bus with an equal length symmetric topology.

In order to implement an equal length symmetric computer bus for a standard personal computer, it is necessary to route the bus traces such that each trace has the same length from a central junction to each node, yet keep the bus connectors parallel to one another. FIG. 7b illustrates the traces required for a single symmetric equal length bus signal in a six node system.

In the equal length symmetric bus of FIG. 7b, the row of central junction points 65 is centered between the six bus connectors 61. A first pair of traces 68 extends from the outermost bus connectors to the central junction point 65. The traces 68 from the outermost bus connectors are almost completely straight, bending only to route around the pins from the inner bus connectors. A second pair of traces 67 extends from the second outermost bus connectors to the central junction point 65. The second pair of traces 67 contains an extra bend that initially extends slightly away from the central junction point 65, and then routes back to the central junction point 65. The extra bend away from the central junction point creates extra length in the traces 67 to make the traces 67 the same length as the traces 68. Finally, a third pair of traces 66 extends from the innermost bus connectors to the central junction point 65. The traces 66 contain a larger extra bend that initially extends away from the central junction point 65 almost reaching the next bus connector, and then returns to the central junction point 65. The extra bend provides added length to the traces 66 to make the traces 66 the same length as the traces 67 and 68.

To prevent crosstalk between different bus signals, the traces of different bus signals should be placed some minimum distance from one another. It has been determined that if the traces are of a thickness D, there should be a minimum distance of 3D between the bus signal traces and any other traces to prevent crosstalk. For example, if the bus signal traces are 6 thousandths of an inch wide, there should be a minimum distance of 18 thousandths of an inch between the bus signal traces and any other electrical traces. The traces should be routed closely together in parallel such that an equal length symmetric bus with any number of signals can be constructed.

AN EMBODIMENT OF THE PRESENT INVENTION

Figure 8:
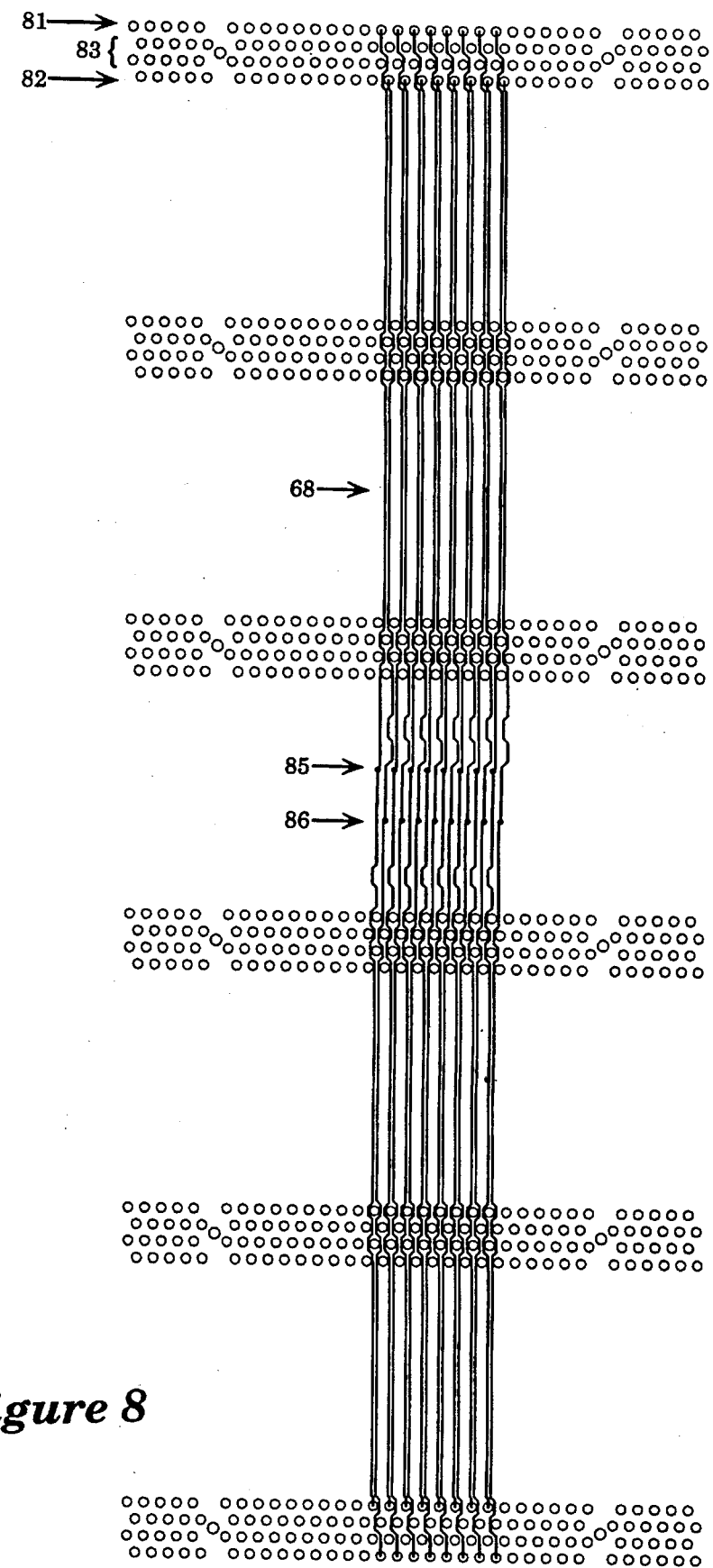
FIG. 8 is a diagram of the present invention being used to implement tracings to the outermost connectors in an IBM® Micro Channel® bus with six connectors.
Figure 9:
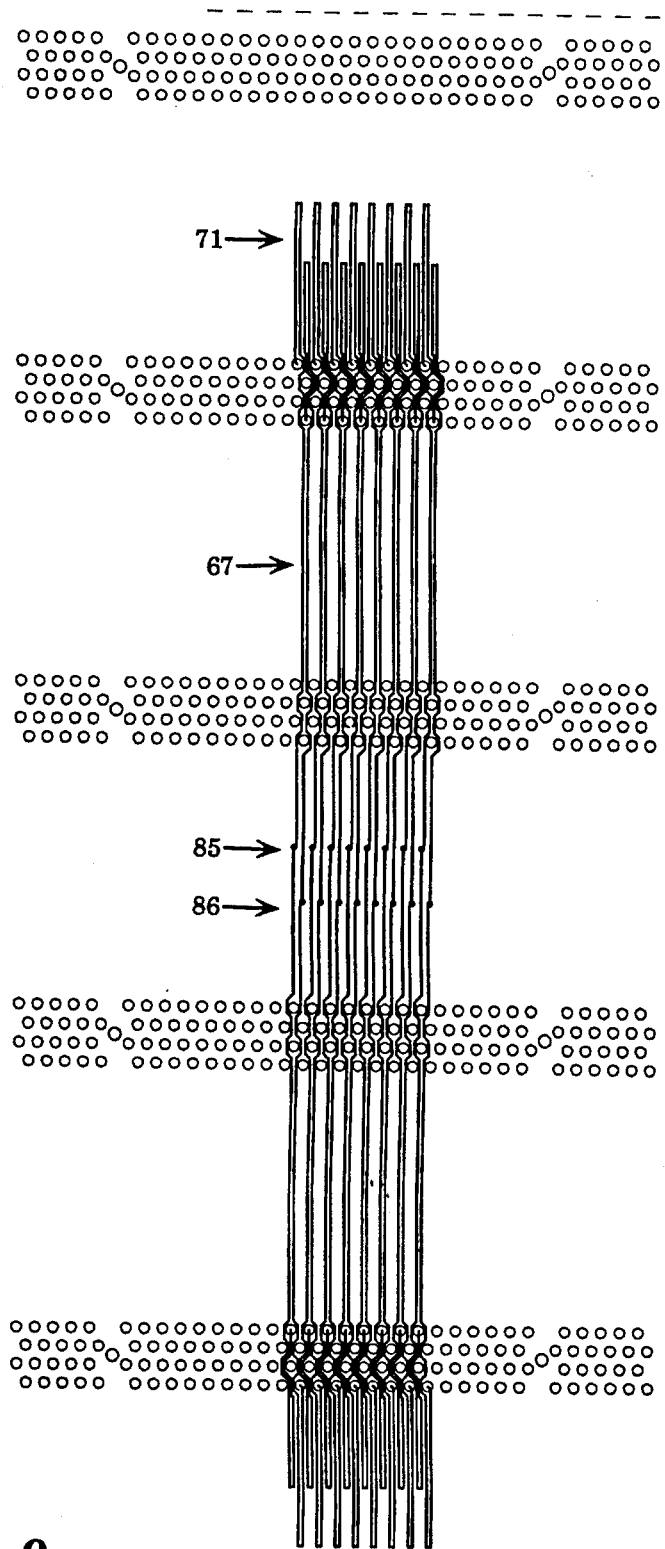
FIG. 9 is a diagram of the present invention being used to implement tracings to the middle connectors in an IBM® Micro Channel® bus with six connectors.
Figure 10:
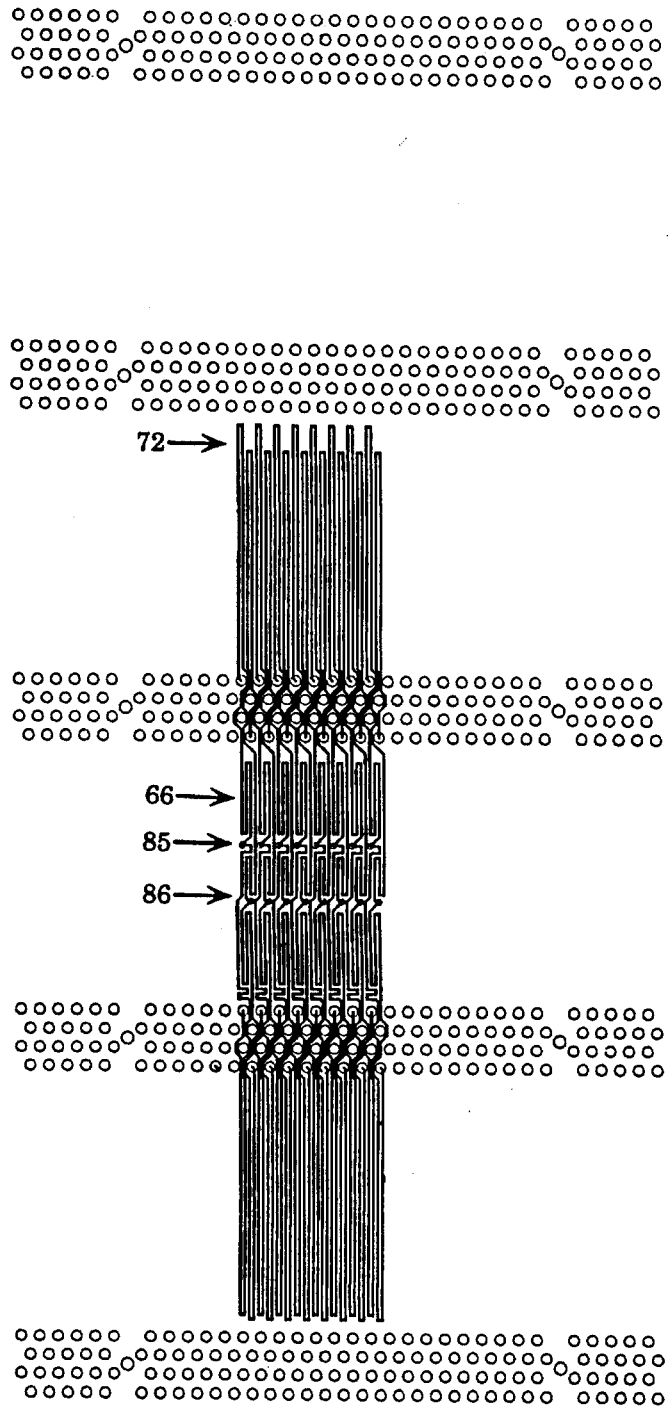
FIG. 10 is a diagram of the present invention being used to implement tracings to the innermost connectors in an IBM® Micro Channel® bus with six connectors.

Referring to FIGS. 8, 9, and 10, illustrate an expandable symmetric equal length bus topology as taught by the present invention using the IBM® Micro Channel® bus connector. In the IBM® Micro Channel® bus connectors illustrated in FIGS. 8, 9, and 10 the outer two rows pins 81 and 82 are used to carry bus signals. The inner two rows pins 83 are used only as power and ground pins. Traces extend from each of the pins in the two rows of bus signal pins 81 and 82 to two central junction point rows 85 and 86 respectively. Although the traces for only 8 bus signals are illustrated, the traces are routed closely together in parallel such that any number of bus signals can be connected.

To accommodate the six nodes, the printed circuit board traces for the bus signals are placed onto three separate printed circuit board layers. A first printed circuit board layer illustrated in FIG. 8 connects the two outermost of bus connectors. A second printed circuit board layer illustrated in FIG. 9 connects the next inner pair of bus connectors. A third printed circuit board layer illustrated in FIG. 10 connects the two innermost of bus connectors.

FIG. 8 illustrates the first printed circuit board layer containing the traces from the outermost bus connectors. The traces 68 run almost straight from the bus signal pins to the central junction rows 85 and 86. Slight bends are made in the traces to avoid the pins of the inner bus connectors.

Referring to FIG. 9, the second printed circuit board layer containing the traces from the next outer bus connectors is illustrated. The traces 67 have a slight bend 71 that initially extends away from the central junction rows 85 and 86 then travel back to the central junction rows 85 and 86. The slight bend 71 adds extra length to the traces 67 to make the traces 67 the same length as the traces 68 from the printed circuit board layer in FIG. 8.

FIG. 10 illustrates the third printed circuit board layer containing the traces from the next outer bus connectors. The traces 66 have a slight bend 72 that initially extends away from the central junction rows 85 and 86 then travel back to the central junction rows 85 and 86. The slight bend 72 adds extra length to the traces 66 to make the traces 66 the same length as the traces 68 and the traces 67 from the printed circuit board layer in FIGS. 8 and 9 respectively.

As evident from the printed circuit board traces in FIGS. 8, 9, and 10, all of the bus signal lines from all bus connectors are of equal length and terminate at a central set of bus signal junction points.

The foregoing has described an equal length symmetric computer bus topology. It is contemplated that changes and modifications may be made by one of ordinary skill in the art, to the materials and arrangements of elements of the present invention without departing from the scope of the invention.

We claim:

1. In a computer system, a computer bus system for transmitting a plurality of bus signals, said computer bus system comprising:

a single multi-layered printed circuit board;

a plurality of physically parallel bus connectors on said single multi-layered printed circuit board, each of said physically parallel bus connectors for transmitting and receiving said plurality of bus signals;

a plurality of bus signal paths on said single multi-layered printed circuit board, each bus signal path carrying one of said bus signals, each of said bus signal paths comprising, a passive central junction point; and a plurality of transmission paths, said plurality of transmission paths extending from said passive central junction point to each of said physically parallel bus connectors such that every bus connector is coupled to said passive central junction point, each of said transmission paths having an equal length.

2. The computer bus system as claimed in claim 1 wherein each of said transmission paths have identical electrical properties.

3. The computer bus system as claimed in claim 1 wherein each of said physically parallel bus connectors have identical electrical properties.

4. The computer bus system as claimed in claim 1 wherein said plurality of physically parallel bus connectors are also electrically parallel to one another.

5. The computer bus system as claimed in claim 4 wherein said passive central junction point for each of said bus signal paths is centered between said plurality of physically parallel bus connectors.

6. The computer bus system claimed in claim 5 wherein said bus signal paths comprise printed circuit board traces on said multi-layered single printed circuit board.

7. The computer bus system as claimed in claim 6 wherein said printed circuit board traces are routed in a serpentine pattern.

8. The computer bus system as claimed in claim 7 wherein said bus comprises a Micro Channel Bus.

9. The computer bus system as claimed in claim 7 wherein said multi-layered printed circuit board traces are of a thickness D and said printed circuit board traces are at least a distance 3D apart from each other.

10. A method of constructing a computer bus system for transmitting a plurality of bus signals, said method comprising the steps of:

arranging a plurality of bus connectors on a single multi-layered printed circuit board such that said bus connectors are physically parallel, each of said bus connectors for transmitting and receiving said bus signals;

placing a passive central junction point on said multi-layered single printed circuit board for each bus signal;

electrically connecting each of said passive central junction points on said single multi-layered printed circuit board to each of said physically parallel bus connectors on said single printed circuit board with a plurality of electrical lines of equal length.

11. The method of constructing a computer bus system as claimed in claim 10 wherein each of said plurality of electrical lines have identical electrical properties.

12. The method of constructing a computer bus system as claimed in claim 10 wherein each of said physically parallel bus nodes have identical electrical properties.

13. The method of constructing a computer bus system as claimed in claim 10 wherein the step of placing a passive central junction point for each bus signal further comprises centering said passive central junction point between said plurality of physically parallel bus connectors.

14. The method of constructing a computer bus system as claimed in claim 13 wherein the step of electrically connecting each of said passive central junction points to each of said physically parallel bus connectors comprises etching traces on said single multi-layered printed circuit board.

15. The method of constructing a computer bus system as claimed in claim 14 wherein the step of electrically connecting each of said passive central junction points to each of said physically parallel bus connectors comprises routing said multi-layered printed circuit board traces in a serpentine pattern.

16. The method of constructing a computer bus system as claimed in claim 15 wherein each of said physically parallel bus connectors comprise a Micro-channel bus connector.

17. The method of constructing a computer bus system as claimed in claim 14 wherein said printed circuit board traces are of a thickness D and said multi-layered printed circuit board traces are at least a distance 3D apart from each other.

18. A computer system with a computer bus system that minimizes the effect of transmission line reflections, said computer system comprising:

a single multi-layered printed circuit motherboard;

a computer bus on said multi-layered single printed circuit motherboard, said computer bus transmitting a plurality of bus signals to a plurality of physically parallel bus connectors on said single multi-layered printed circuit motherboard, each of said physically parallel bus connectors for transmitting and receiving said bus signals, each of said bus signals carried on a bus signal path, each of said bus signal paths bus comprising:

a passive central junction point, said passive central junction point centered between said plurality of physically parallel bus connectors;

a plurality of transmission paths, said plurality of transmission paths extending from said passive central junction point to each of said plurality of physically parallel bus connectors such that every physically parallel bus connector is coupled to said passive central junction point, each of said transmission paths having an equal length;

a processor coupled to said computer bus system, said processor being one of said physically parallel bus connectors; and a memory unit coupled to said computer bus system, said memory unit being one of said physically parallel bus connectors.

19. The computer system as claimed in claim 18 wherein each of said transmission paths have substantially identical electrical characteristics.

20. The computer system as claimed in claim 19 wherein said transmission paths comprise printed circuit board traces on said multi-layered printed circuit motherboard.

* * * * *